United States Patent [19]
Kohler et al.

[11] 3,932,810
[45] Jan. 13, 1976

[54] TEMPERATURE COMPENSATED COMBINED CURRENT AND VOLTAGE MEASURING APPARATUS

[75] Inventors: Werner Kohler, Bentfeld, Holstein; Norbert Steinemer, Berlin, both of Germany

[73] Assignee: Siemens Aktiengesellschaft, Munich, Germany

[22] Filed: Nov. 29, 1974

[21] Appl. No.: 528,490

[30] Foreign Application Priority Data
Dec. 20, 1973 Germany............................ 2363932

[52] U.S. Cl. .................. 324/126; 323/93; 324/105; 324/123 R; 324/127
[51] Int. Cl.² .................. G01R 15/04; G01R 15/00
[58] Field of Search........ 324/123 R, 127, 126, 105; 323/93

[56] References Cited
UNITED STATES PATENTS
3,396,339   8/1968   Miram ............................... 324/126
FOREIGN PATENTS OR APPLICATIONS
1,114,921   10/1961   Germany ............................ 324/126

*Primary Examiner*—Alfred E. Smith
*Assistant Examiner*—Ernest F. Karlsen
*Attorney, Agent, or Firm*—Kenyon & Kenyon Reilly Carr & Chapin

[57] ABSTRACT

The combined current and voltage measuring apparatus has a cast resin body which supports the current measuring unit. The voltage measuring unit includes a capacitive voltage divider with an amplifier connected thereto. The cast resin body is also utilized as dielectric for the capacitor on the high-voltage side of the capacitive voltage divider. Embedded in the cast resin body is an auxiliary capacitor with a dielectric which, with respect to temperature dependence, corresponds to the dielectric of the high-voltage capacitor. The auxiliary capacitor, in series with a resistor, is connected to an auxiliary generator. The voltage dropped across the resistor is supplied, after rectification, to an input of a differential amplifier; the other input of the differential amplifier is connected to the terminal away from ground of the capacitor on the low-voltage side of the capacitive voltage divider. With respect to the capacitors of the capacitive voltage divider, a warming of the capacitor on the high-voltage side different from the warming of the capacitor on the low-voltage side does not influence the measuring accuracy of the capacitive voltage measuring unit of the apparatus.

8 Claims, 1 Drawing Figure

U.S. Patent   Jan. 13, 1976   3,932,810
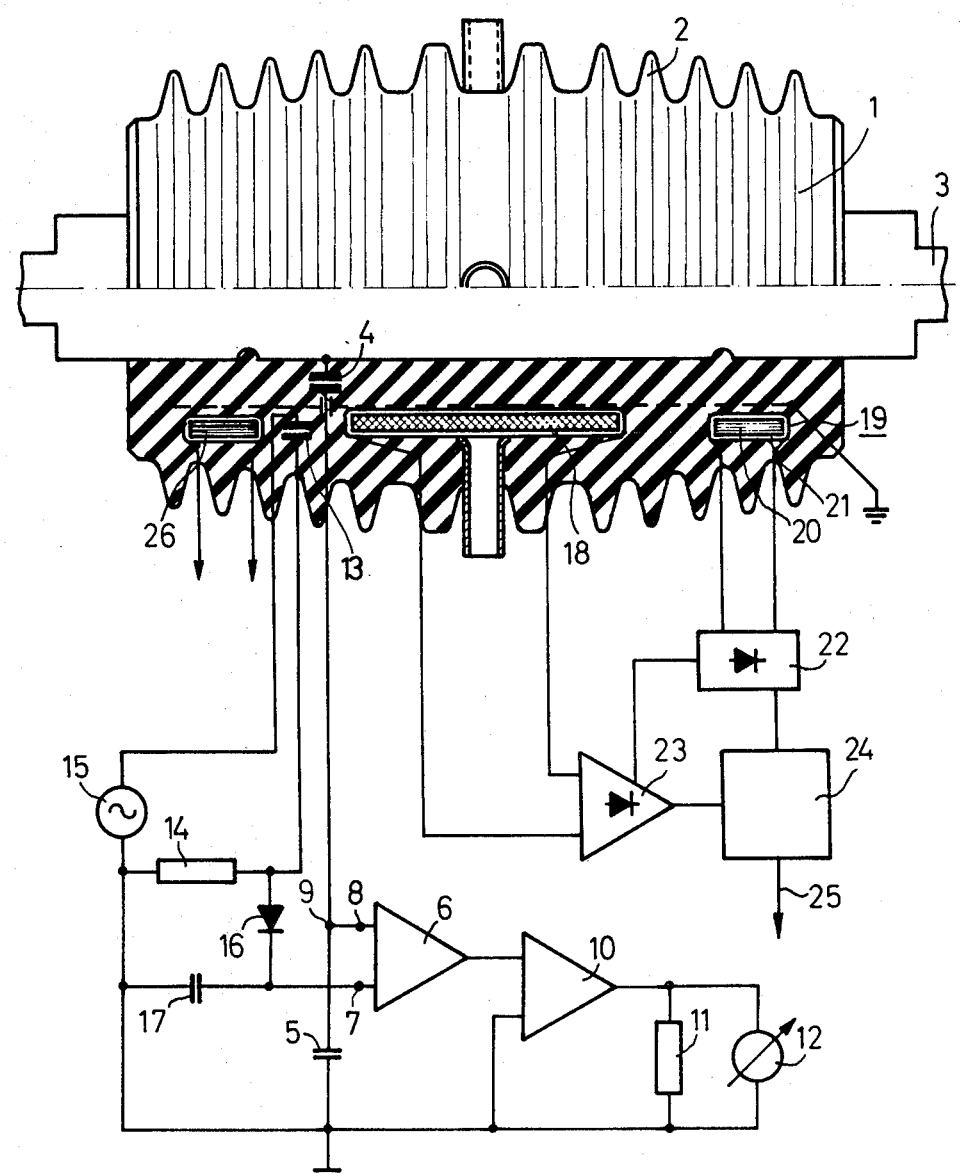

TEMPERATURE COMPENSATED COMBINED CURRENT AND VOLTAGE MEASURING APPARATUS

BACKGROUND OF THE INVENTION

The invention relates to a combined current and voltage measuring apparatus with a cast resin body which supports the current measuring unit and is also utilized as dielectric for the capacitor on the high-voltage side of the capacitive voltage divider equipped with an amplifier of a capacitive measuring unit.

A combined current and voltage transformer is known from Deutsche Auslegeschrift No. 1,114,921 wherein the voltage transformer unit contains a capacitive divider. The dielectric of the winding insulation of the current transformer unit is also utilized as dielectric for the capacitor on the high-voltage side of the capacitive divider in that there are applied to the winding insulation conducting coatings forming the electrodes of the high-voltage capacitor.

In the combined current and voltage transformer of the known construction, inaccuracies of the voltage measurement may result because the divider ratio determined by the selection of the high-voltage and the low-voltage capacitors can change because of different temperature changes in these respective capacitors. The cause for different warming of the high-voltage and the low-voltage capacitors can be attributed to the condition that the primary conductor of the current transformer unit, heated by the current flowing through it, heats up and transfers its heat to the adjacent winding insulation which is utilized at the same time as dielectric of the high-voltage capacitor; this results in a variation of the capacitance of the high-voltage capacitor and, hence, to a variation of the divider ratio of the capacitive voltage which, in turn, leads to measuring inaccuracies.

Accordingly, it is an object of the invention to provide a combination current and voltage measuring apparatus wherein a cast resin body serving as dielectric for the high-voltage capacitor is configured in such a manner that a warming of the high-voltage capacitor different from the warming of the low-voltage capacitor does not influence the measuring accuracy of the capacitive voltage measuring unit of the apparatus.

SUMMARY OF THE INVENTION

The temperature compensated combined current and voltage measuring apparatus according to the invention realizes the above object by providing an auxiliary capacitor having a dielectric corresponding to the dielectric of the high-voltage capacitor of the capacitive voltage divider with respect to temperature dependence. The auxiliary capacitor is embedded in the cast resin body of the combined current and voltage measuring apparatus of the type described above. The auxiliary capacitor, in series with a resistor, is connected to an auxiliary generator and the voltage dropped across the resistor is supplied, after rectification, to an input of a difference amplifier. The other input of the differential amplifier is connected to the terminal of the low-voltage capacitor of the capacitive voltage divider opposite from ground.

The combined current and voltage measuring apparatus according to the invention offers the advantage that the voltage processed by the differential amplifier is decreased more or less by a direct-current voltage of greater or lesser magnitude generated at the one input of the differential amplifier as a function of the warming of the cast resin body, as compared to the voltage dropping at the low-voltage capacitor as a function of the variation of the capacitance of the high-voltage capacitor due to heating. This leads to the condition that the divider ratio, disturbed such as by relatively severe heating of the high-voltage capacitor, exerts no influence on the accuracy of the voltage measurement because the disturbed divider ratio is compensated in the differential amplifier by the auxiliary voltage applied to the one input of the differential amplifier. The condition that only an auxiliary voltage of positive amount is supplied to the one input of the differential amplifier of the current and voltage measuring apparatus according to the invention in no way impairs the mode of operation with respect to the compensation of a disturbed divider ratio, because the dimensioning of the apparatus according to the invention can be based on a suitable assumed temperature as reference point.

The current measuring unit of the combined current and voltage measuring apparatus according to the invention may be of various configurations. It is considered advantageous, however, if a sensor consisting of a winding without ferrous core is used as sensor for the current measuring unit and that at least one device with an iron core and applied winding is present which forms a saturation current transformer with the conductor of the high-voltage switch gear carrying the current to be measured; the ends of the winding without ferrous core are connected to the input of an amplifier, the operating voltage of which is supplied by the winding of the saturation current transformer. This configuration of the current measuring unit has the advantage that, because of the elimination of the iron core, the precautionary measures for the prevention of influences on the core due to the shrinkage of the cast resin are unnecessary which has a beneficial effect on the production costs. An additional operating voltage source for the amplifier of the current measuring unit is not required because the operating energy needed is made available by the saturation current transformer. One significant advantage of the current measuring unit according to the invention is seen in the fact that saturation phenomena in the winding without ferrous core cannot occur; this has an advantageous effect on the transmission accuracy in the event of excess currents.

The device with the iron core and applied secondary winding for the formation of the saturation current transformer may be disposed in a separate cast resin current and voltage measuring apparatus; however, it appears more advantageous, if only for reasons of production, if the device with the iron core and applied winding is also embedded in the same cast resin body.

Although the invention is illustrated and described herein as a temperature compensated combined current and voltage measuring apparatus, it is nevertheless not intended to be limited to the details shown, since various modifications may be made therein within the scope and the range of the claims. The invention, however, together with additional objects and advantages will be best understood from the following description and in connection with the accompanying drawing.

BRIEF DESCRIPTION OF THE DRAWING

The drawing is a schematic diagram, partially in section, of a temperature compensated combined current and voltage measuring apparatus according in the invention.

DESCRIPTION OF THE PREFERRED EMBODIMENTS OF THE INVENTION

The current and voltage measuring apparatus according to the invention contains a body 1 of casting resin which is provided with ribs 2 to lengthen the surface leakage path. The casting resin body 1 is penetrated by a conductor 3 to which the voltage to be measured is applied and which carries the current to be measured.

Embedded in the cast resin body 1 is a high-voltage capacitor 4 of a capacitive divider. The low-voltage capacitor 5 of the divider is disposed outside of the cast resin body 1. The capacitive voltage divider is followed by a differential amplifier 6, the one input 7 is connected to external components as described below in greater detail; the other input 8 of the amplifier 6 is connected to the terminal 9 of the low-voltage capacitor 5 opposite from ground. The differential amplifier 6 is followed by another amplifier 10, to the output of which a resistor 11 is connected. Connected parallel to the resistor 11 is aa voltmeter 12 from which a voltage proportional to the voltage on conductor 3 can be read.

In addition to the capacitor 4 on the high-voltage side of the capacitor voltage divider, there is embedded in the cast resin body 1 an auxiliary capacitor 13 which is fed by an auxiliary generator 15 through a resistor 14. The auxiliary capacitor 13 has a dielectric, the temperature dependence of which corresponds to that of the high-voltage capacitor 4. Consequently, the capacitance of the auxiliary capacitor 13 varies in the same manner as that of the high-voltage capacitor 4 when the cast resin body 1 heats up. This affects the level of the voltage dropped across the resistor 14 so that the voltage at the resistor 14 decreases as the capacitance of the auxiliary capacitor 13 decreases.

The voltage dropped at the resistor 14 is rectified through a precision rectifier 16 is smoothed by means of a succeeding capacitor 17. The direct-current voltage thus obtained is supplied to the one input 7 of the differential amplifier 6.

Suppose, for example, the cast resin body 1 heats up more than the low-voltage capacitor 5 because the conductor 3 heats up; this condition will lead to a lowering of the dielectric characteristic of the dielectric of the high-voltage capacitor 4 which, in turn, manifests itself in a variation of the divider ratio so that the voltage which can be taken from the low-voltage capacitor 5 is now lower, this being so even though the same voltage is on the conductor 3. However, the heating up of the cast resin body 1 also has the effect of a corresponding variation of the dielectric characteristic of the dielectric of the auxiliary capacitor 13 so that, because of the reduced capacity of the auxiliary capacitor 13, less current flows through the resistor 14 which, in turn, reduces the voltage supplied to the input of the differential amplifier 6. The influence of the direct-current voltage supplied to this input is thereby diminished so that the differential voltage formed by the differential amplifier 6 corresponds to the value prior to the heating up of the cast resin body 1. Therefore, the divider ratio which was changed because of heating is in this way compensated. The influence on the reading of the voltmeter 12 because of temperature changes of the high-voltage capacitor 4 is thus avoided.

In addition to the high-voltage capacitor 4 and the auxiliary capacitor 13, the cast resin body 1 of the combined current and voltage measuring apparatus according to the invention contains a current measuring unit which comprises a winding 18 without ferrous core and at least one device 19 containing an iron core 20 with a winding 21. The device 19 with iron core 20 and winding 21, together with the conductor 3, form a saturation current transformer. By utilizing a rectifier 22 connected to the winding 21, the device 19 assures that an amplifier 23 connected to the ends of the coreless winding 18 can be supplied with operating energy. The amplifier 23 then furnishes a voltage which is a measure of the current in the conductor 3 and which, if applicable, can be processed further in an electronic protective device. If long-range transmission of the output voltage of the amplifier 23 is desired, it is expedient to have the amplifier 23 followed by an analog-digital converter 24 which furnishes at its output 25 is a frequency proportional to the current in the conductor 3 when a voltage-frequency converter is utilized.

To asssure that the amplifier 23 and, if applicable, the analog-digital converter 24, are supplied with current also when the currents in the conductor 3 are small, several devices with iron core and winding may be provided, each such device forming a saturation current transformer with the conductor 3. Only one such additional device 26 is shown in the drawing. At small currents in the conductor 3 it is expedient to connect this device 26 in series with the device 19 and, if applicable, other devices, it being possible to use electronic switches (not shown) for this series arrangement.

As has already been expressed in the foregoing, the invention is applicable not only to combined current and voltage measuring apparatus in which the cast resin body is co-utilized as dielectric for the capacitor on the high-voltage side of the capacitive voltage divider, but also to devices in which a complete capacitor is embedded in the cast resin body. These two configurations of the capacitor on the high-voltage side of a capacitive divider should be considered as equivalent constructions within the scope of the present invention.

A combined current and voltage measuring apparatus is taught by the invention which, with respect to the voltage measuring unit, offers the advantage that temperature changes of the cast resin body accommodating the high-voltage capacitor, or temperature changes of the cast resin body co-utilized as dielectric, exert no influence on the voltage measurement. With respect to the current measuring unit, the current and voltage measuring apparatus according to the invention is advantageous inasmuch as it makes a very compact configuration of the cast resin body possible because the current measuring unit functions without iron core; transmission inaccuracies due to saturation phenomena cannot occur.

What is claimed is:

1. A temperature compensated combined current and voltage measuring apparatus for measuring voltage and current on a conductor for conducting current at an upper potential comprising: a body of cast resin disposed in surrounding relation to the conductor; current measuring means carried by said body of cast resin for sensing the current in the conductor; a capacitive voltage divider having upper and lower potential capacitors and extending between the upper potential and a lower potential; said upper potential capacitor being arranged with respect to said cast resin body as to cause said cast resin to be the dielectric thereof; and, a temperature compensating arrangement including: an auxiliary capacitor embedded in the cast resin body and having a dielectric subjected to the same temperature changes as the dielectric of said upper potential capacitor whereby the capacitance of said auxiliary capacitor changes in the same manner as the capacitance of said upper potential capacitor; a resistor serially connected to said auxiliary capacitor; a generator connected across the serial combination of said auxiliary capacitor and said resistor thereby causing a voltage to drop across said resistor having magnitude indicative of the capacitance of said auxiliary capacitor; rectifying and smoothing means for rectifying and smoothing said voltage; and, a differential amplifier having first and second inputs, said first input being connected to receive the smoothed rectified voltage dropped across said resistor, and said second input being connected to said capacitive voltage divider at the terminal of said low-voltage capacitor away from said lower potential whereby a change in the divider ratio of said capacitive voltage divider caused by changes in the temperature of said upper potential capacitor is compensated.

2. The apparatus of claim 1 comprising an amplifier connected through said differential amplifier to said lower potential capacitor of said capacitive voltage divider to conjointly define with said capacitive voltage divider and said temperature compensating arrangement a temperature compensated capacitive voltage measuring unit for supplying a voltage proportional to the voltage on the conductor.

3. The apparatus of claim 2, said current measuring means comprising: a coreless winding carried by said cast resin body for sensing the current in the conductor; a further amplifier having input terminals connected to said coreless winding whereby said further amplifier supplies an electrical quantity proportional to the current conducted by the conductor; and, a wound member made up of an iron core having a winding wound thereon, said wound member and the conductor conjointly defining a saturation current transformer for supplying an operating supply voltage to said further amplifier.

4. The apparatus of claim 3, said wound member being embedded in said cast resin body.

5. The apparatus of claim 4 comprising a voltage-frequency converter connected to the output of said further amplifier.

6. The apparatus of claim 3 comprising a voltage-frequency converter connected to the output of said further amplifier.

7. The apparatus of claim 1, said upper potential capacitor of said capacitive voltage divider being embedded in said body of cast resin.

8. The apparatus of claim 7 comprising an amplifier connected through said differential amplifier to said lower potential capacitor of said capacitive voltage divider to conjointly define with said capacitive voltage divider and said temperature compensating arrangement a temperature compensated capacitive voltage measuring unit for supplying a voltage proportional to the voltage on the conductor.

* * * * *

UNITED STATES PATENT AND TRADEMARK OFFICE
CERTIFICATE OF CORRECTION

PATENT NO. : 3 932 810
DATED : January 13, 1976
INVENTOR(S) : Werner Kohler et al It is certified that error appears in the above-identified patent and that said Letters Patent are hereby corrected as shown below:

In column 2, line 54, add --body of the combined-- after the words "separate cast resin"

In column 3, line 31, change "capacitor" to --capacitive--

Signed and Sealed this thirtieth Day of March 1976

[SEAL]

Attest:

RUTH C. MASON
*Attesting Officer*

C. MARSHALL DANN
*Commissioner of Patents and Trademarks*